United States Patent
Iketani et al.

(10) Patent No.: US 12,150,254 B2
(45) Date of Patent: Nov. 19, 2024

(54) METHOD OF FORMING A LAMINATE STRUCTURE HAVING A PLATED THROUGH-HOLE USING A REMOVABLE COVER LAYER

(71) Applicant: Sanmina Corporation, San Jose, CA (US)

(72) Inventors: Shinichi Iketani, San Jose, CA (US); Dale Kersten, San Jose, CA (US)

(73) Assignee: Sanmina Corporation, San Jose, CA (US)

( * ) Notice: Subject to any disclaimer, the term of this patent is extended or adjusted under 35 U.S.C. 154(b) by 1123 days.

(21) Appl. No.: 17/001,431

(22) Filed: Aug. 24, 2020

(65) Prior Publication Data

US 2021/0014980 A1    Jan. 14, 2021

Related U.S. Application Data

(62) Division of application No. 14/312,679, filed on Jun. 23, 2014, now Pat. No. 10,757,819.

(Continued)

(51) Int. Cl.
H05K 3/42    (2006.01)

(52) U.S. Cl.
CPC .............. H05K 3/429 (2013.01); *H05K 3/427* (2013.01); *H05K 2203/308* (2013.01);
(Continued)

(58) Field of Classification Search
CPC .............. H05K 3/429; H05K 2203/308; H05K 3/0094; H05K 3/427; H05K 3/10;
(Continued)

(56) References Cited

U.S. PATENT DOCUMENTS 4,023,998 A * 5/1977 Cederberg ........... H05K 3/0047
156/247
5,343,616 A    9/1994 Roberts
(Continued)

FOREIGN PATENT DOCUMENTS

CN    1244460 A    2/2000
CN    1610491 A    4/2005
(Continued)

OTHER PUBLICATIONS

Akulin A. Proektirovanie gibko-zhestkikh pechatnykh plat. Materialy, konstruktsii i osobennosti proektirovaniya. Tekhnologii v elektronnoi promyshlennosti, No. 8'2007, p. 46-49.
(Continued)

*Primary Examiner* — Philip C Tucker
*Assistant Examiner* — Andrew L Swanson
(74) *Attorney, Agent, or Firm* — Tyler Barrett; LOZA & LOZA, LLP

(57) ABSTRACT

A core or sub-composite structure is provided including a dielectric layer between a first conductive film and a second conductive film. The first conductive film may include a first peelable/removable cover layer formed on or coupled to a first conductive layer. The second conductive film may include a second peelable/removable cover layer formed on or coupled to a second conductive layer.

8 Claims, 6 Drawing Sheets

Related U.S. Application Data

(60) Provisional application No. 61/838,163, filed on Jun. 21, 2013.

(52) U.S. Cl.
CPC .. *Y10T 428/2495* (2015.01); *Y10T 428/24967* (2015.01); *Y10T 428/24975* (2015.01); *Y10T 428/31529* (2015.04); *Y10T 428/31544* (2015.04); *Y10T 428/31678* (2015.04); *Y10T 428/31681* (2015.04)

(58) Field of Classification Search
CPC ........... H05K 2203/0264; H05K 3/025; H05K 3/425; H05K 3/428; Y10T 428/2495; Y10T 428/24967; Y10T 428/24975; Y10T 428/31529; Y10T 428/31544; Y10T 428/31678; Y10T 428/31681
See application file for complete search history.

(56) References Cited

U.S. PATENT DOCUMENTS

| | | | |
|---|---|---|---|
| 6,370,034 B1 | 4/2002 | Busch | |
| 2002/0092677 A1* | 7/2002 | Farquhar | H05K 3/429 174/262 |
| 2003/0008489 A1* | 1/2003 | Koblis | H01L 21/4853 438/612 |
| 2005/0037605 A1* | 2/2005 | Kim | H01L 21/76808 438/622 |
| 2005/0241954 A1* | 11/2005 | Iwanami | H05K 3/243 205/291 |
| 2006/0191709 A1* | 8/2006 | Kim | H01L 21/486 174/250 |
| 2008/0301934 A1* | 12/2008 | Dudnikov, Jr. | H05K 1/0257 29/830 |
| 2009/0056998 A1 | 3/2009 | Booth, Jr. et al. | |
| 2009/0220683 A1* | 9/2009 | Gotoh | H05K 3/421 427/123 |

FOREIGN PATENT DOCUMENTS

| | | |
|---|---|---|
| CN | 1672474 A | 9/2005 |
| CN | 101133478 A | 2/2008 |
| CN | 102548251 A | 7/2012 |
| CN | 102595799 A | 7/2012 |
| CN | 102625604 A | 8/2012 |
| EP | 0804061 A1 | 10/1997 |
| JP | 1993319675 | 3/1993 |
| JP | 19979036550 A | 2/1997 |
| JP | H0936550 A | 2/1997 |
| JP | 1997263727 | 10/1997 |
| JP | 2005330407 | 12/2005 |
| JP | 2008246858 A | 10/2008 |
| RU | 2267872 C1 | 1/2006 |

OTHER PUBLICATIONS

International Search Report and Written Opinion for PCT/IB14/02315 dated Apr. 9, 2015; 7 pages.
EP Patent Appln. No. 14822699.6. Applicant: Sanmina Corporation. Extended European Search Report (Mar. 8, 2017).

\* cited by examiner

METHOD OF FORMING A LAMINATE STRUCTURE HAVING A PLATED THROUGH-HOLE USING A REMOVABLE COVER LAYER

CLAIM OF PRIORITY

The present Application for Patent is a divisional application of U.S. patent application Ser. No. 14/312,679 entitled "METHOD OF FORMING A LAMINATE STRUCTURE HAVING A PLATED THROUGH-HOLE USING A REMOVABLE COVER LAYER", filed Jun. 23, 2014, which claims priority to U.S. Provisional Application No. 61/838,163 entitled "METHOD OF FORMING A LAMINATE STRUCTURE HAVING A PLATED THROUGH-HOLE USING A PEELABLE COVER LAYER", filed Jun. 21, 2013, both of which are hereby expressly incorporated by reference.

FIELD

Various features relate to laminate structures, and more particularly, to a method of forming a sub-composite structure, having a plated through-hole, using a removable or peelable cover layer to clean via fill material, such as plating resist, from upper and lower surfaces of the sub-composite structure.

BACKGROUND

Laminate structures, such as printed circuit boards, are prepared by first laminating a sub-composite structure with exterior sheets/layers and/or other sub-composite structures. One or more holes may be formed (e.g. drilled) through the sub-composite for buried via holes. This may be followed by depositing plating resist within the one or more holes using a via hole filling machine such as screen printing or a vertical squeeze vacuum via fill. Despite using a via fill machine, the deposition of the plating resist leaves an excess (or residual) plating resist on upper and/or lower surfaces of the sub-composite structure. Once the plating resist has been cured, the excess plating resist needs to be removed from the upper and lower surfaces of the sub-composite structure in order to provide a substantially flat and/or clean upper and/or lower surfaces. However, there currently does not exist a machine that can scrub a thin laminate (e.g., >6 mil limiting panel size by very expensive tight control required tool, >20 mil for standard tool). Manual/hand scrubbing the upper and lower surfaces of the sub-composite structure not only may result in inconsistent surfaces on sub-composite structures (e.g., inconsistent cleaning, varying thicknesses, etc.) but would also be very expensive to implement.

Consequently, what is needed a way to remove excess via fill material, such as plating resist, during the formation of a plated through-hole that is consistent from structure to structure and is time as well as cost effective.

DETAILED DESCRIPTION

In the following detailed description, numerous specific details are set forth in order to provide a thorough understanding of the embodiments. However, it will be understood by one of ordinary skill in the art that the embodiments may be practiced without these specific details. For example, operations may be shown in block diagrams, or not be shown at all, in order not to obscure the embodiments in unnecessary detail. In other instances, well-known operations, structures and techniques may not be shown in detail in order not to obscure the embodiments.

Exemplary Sub-Composite Structure with a Plating Resist Filled Via-Hole

Figure 1:
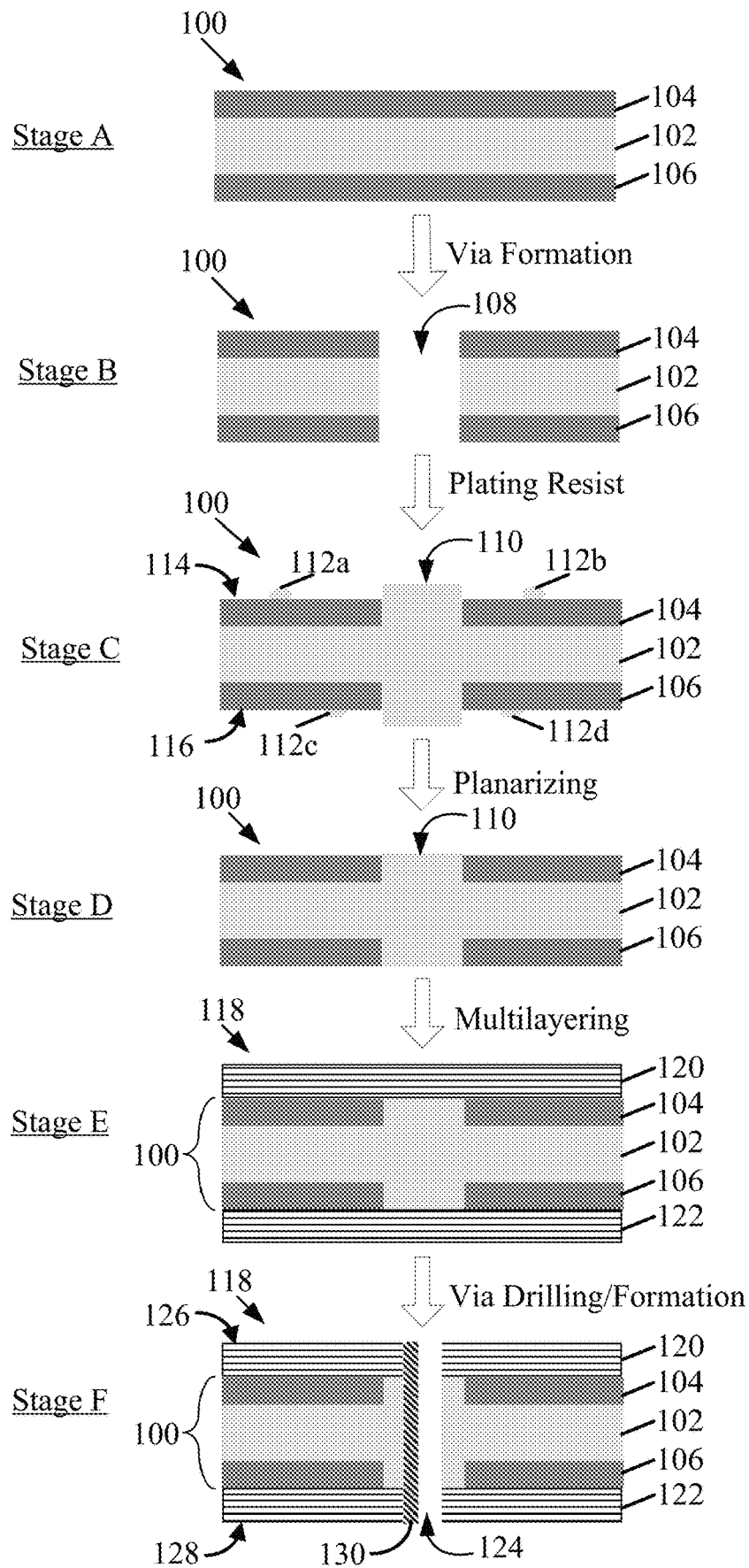
FIG. 1 illustrates a cross-section view of the construction of a typical sub-composite structure having a plating resist filled via hole.

FIG. 1 illustrates a cross-section view of the construction of a sub-composite structure 100 having a plating resist filled via hole. At a first stage (Stage A), the sub-composite structure 100 (e.g., also referred to herein as a core) may include a dielectric layer 102 sandwiched between a first conductive layer or foil 104 and a second conductive layer or foil 106. At a second stage (Stage B), a hole 108 is formed (e.g., by drilling, laser, etc.) through the sub-composite structure 100. At a third stage (Stage C), plating resist 110 is deposited into the hole using, for example, a via hole filling machine or any other method known in the industry. During a subsequent plating process, the plating resist 110 may prevent conductive material from being plated between the first conductive layer or foil 104 and the second conductive layer or foil 106. The deposition of the plating resist may leave an excess or residual plating resist 112 on an upper surface 114 and/or lower surface 116 of the sub-composite structure 100. The plating resist 110 is then cured or semi-cured. At a fourth stage (Stage D), the sub-composite structure 100 may be planarized (e.g., by grinding planarization or other chemical or mechanical processing) to remove excess plating resist to provide a substantially flat surface.

Once the upper and lower surfaces of the sub-composite structure 100 have been cleaned and the fill material cured, the first conductive layer 104 and second conductive layer 106 may be patterned (e.g., to add electrical paths or traces, pads, anti-pads, etc.).

At a fifth stage (Stage E), the sub-composite structure 100 may then be laminated into a multilayer printed circuit board (PCB) 118 or other laminate structure. For instance, one or more layers 120 and 122 (e.g., conductive layers, dielectric layers, etc.) may be laminated onto the upper surface 114 and/or lower surface 116 of the sub-composite structure 100. In one example, additional dielectric layers and/or conductive layers may have been formed on to the sub-composite structure 100. For instance, the sub-composite structure 100 may be laminated with prepreg (bonding sheet) and conductive foil to form the multilayer PCB 118. The conductive layers (e.g., conductive foils) may be patterned to form electrical paths or traces.

At a sixth stage (Stage F), a through-hole 124 is drilled through the multilayer PCB 118, including the plating resist 110 in the sub-composite structure 100. The through-hole 124 may have a diameter smaller than the diameter of the first formed hole 108. The through-hole 124 may then be plated 130, for example, by placing the panel into a seed bath, followed by immersion in an electroless copper bath. The copper plating 130 in the through-hole 124 may be further thickened by electrolytic copper plating to achieve a target or desired thickness. Subsequently, surface circuit patterning may be formed on the upper and/or lower surfaces 126 and 128 of the multilayer PCB 118 and prepared with a surface finish such as solder mask, legend and metallization or organic surface preservative (OSP).

After the printed circuit board (PCB) 118 is completed, electronic components may be attached on the upper and/or lower surfaces 126 and 128 of the multilayer PCB 118 to form a functional printed circuit assembly or other laminated structure.

Figure 2:
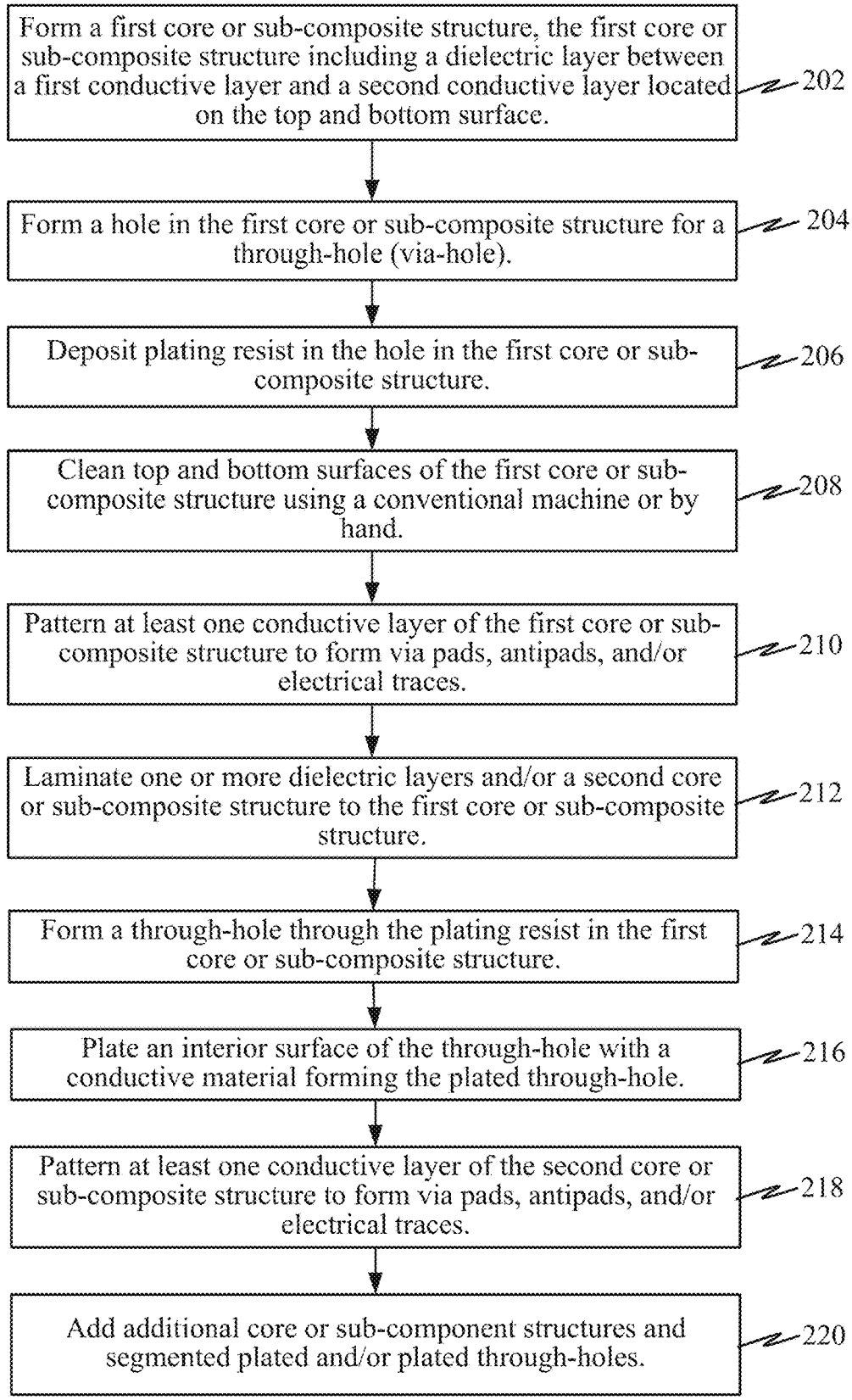
FIG. 2 illustrates a method of forming a typical laminate structure having a vertically segmented plated through-hole.

FIG. 2 illustrates a method of forming a typical laminate structure having a vertically segmented plating resist filled via hole. First, a first core or sub-composite structure is formed, the first core or sub-composite structure including a dielectric layer sandwiched between a first conductive layer or foil and a second conductive layer or foil 202. Next, a hole is formed in the first core or sub-composite structure for a through-hole (via-hole) 204. Plating resist is then deposited in the hole in the first core or sub-composite structure 206.

After depositing the plating resist, the plating resist is cured. A top and bottom surfaces of the first core or sub-composite structure are then cleaned to remove excess (or residual) plating resist 208. Typically, the top and bottom surfaces are planarized (e.g., by grinding planarization or other chemical or mechanical processing) to remove the excess plating resist to provide a substantially flat and clean surface. As described above, these methods cannot scrub thin surfaces using a tool, for example surfaces of 6 mils or less and hand scrubbing the surfaces provides inconsistent results, and is time consuming and expensive.

After cleaning the top and bottom surfaces of the first core or sub-composite structure, at least one conductive layer of the first core or sub-composite structure may be patterned to form via pads, antipads, and/or electrical traces 210. One or more dielectric layers and/or a second core or sub-component structure can then be laminated to the first core or sub-composite structure 212. A through-hole is then formed through the plating resist in the first core or sub-composite structure 214 and an interior surface of the through-hole is plated with a conductive material forming the segmented plated through-hole 216. Next, at least one conductive layer of the second core or sub-composite structure may be patterned to form via pads, antipads, and/or electrical traces 218. Additional core or sub-composite structures and segmented plated and/or plated through-holes can be further added 220.

Figure 3:
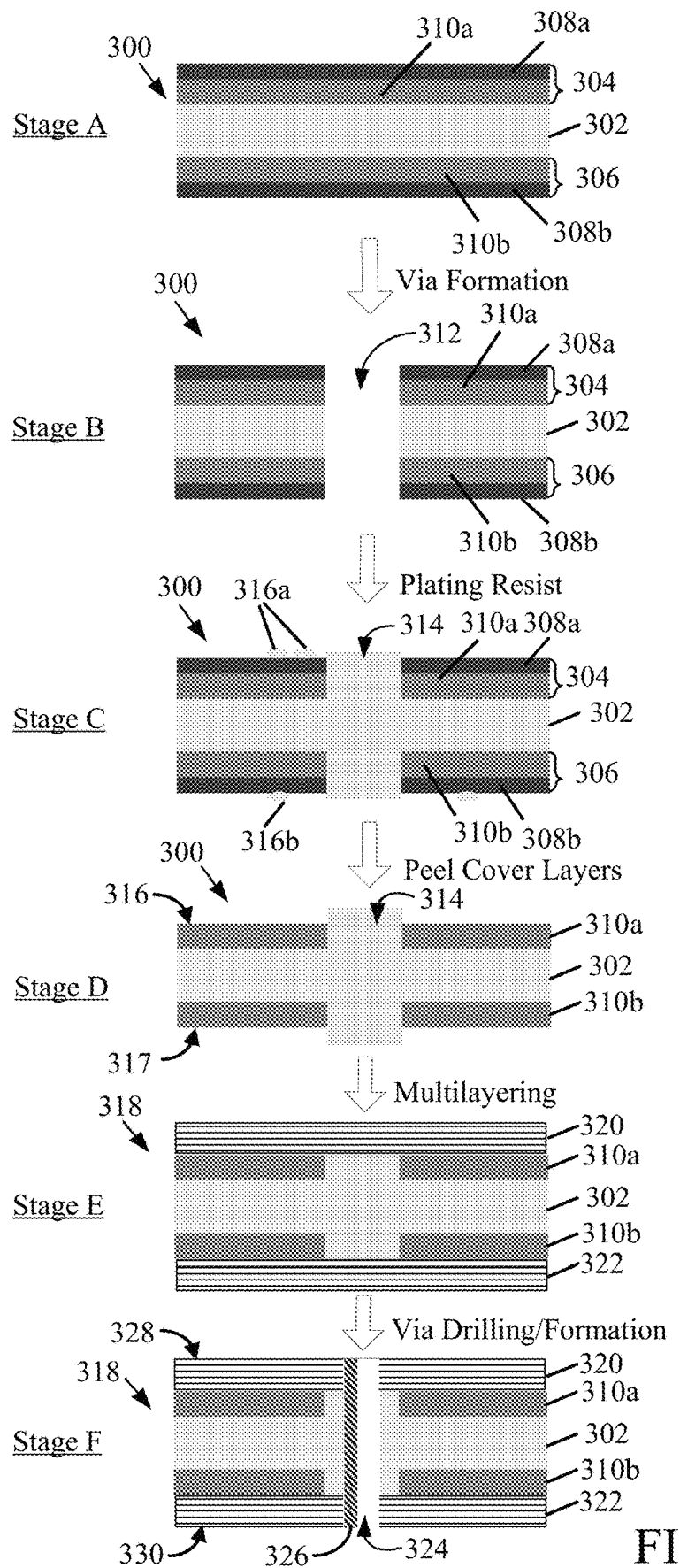
FIG. 3 illustrates the construction of a sub-composite structure having a plating resist filled via hole, according to one aspect of the present invention.

Exemplary Construction of a Sub-Composite Structure with a Plating Resist Filled Via-Hole Using Peelable Cover Layers FIG. 3 illustrates the construction of a sub-composite structure having a plating resist filled via-hole, according to one aspect of the present invention. At a first stage (Stage A), the sub-composite structure 300 (also referred to herein as a core) may formed by a dielectric layer 302 sandwiched between a first conductive film 304 and a second conductive film 306. The first conductive film 304 may comprise a first conductive layer or foil 310a and a first peelable cover layer 308a. The second conductive film 306 may comprise a second conductive layer or foil 310b and a second peelable cover layer 308b. The dielectric layer resin may include a inorganic filler, reinforcing fabric, and/or non-reinforcing fabric/structure.

According to one example, the core or sub-composite structure 300 may have a total thickness of 127 thousands of an inch (mil) or less.

According to another example, the core or sub-composite structure 300 may have a total thickness of 63 thousands of an inch (mil) or less.

According to yet another example, the core or sub-composite structure 300 may have a total thickness of 31 thousands of an inch (mil) or less.

According to yet another example, the core or sub-composite structure 300 may have a total thickness of 16 thousands of an inch (mil) or less.

According to one example, the first and second conductive layers 310a and 310b may be a copper foil that is greater than 3 microns in thickness. In another example, the first and second conductive layers 310a and 310b may be greater than 10 microns in thickness.

According to one example, the first and second peelable cover layers 308a and 308b may be a copper foil that is less than 70 microns in thickness. In another example, the first and second peelable cover layers 308a and 308b may be less than 20 microns in thickness. Alternatively, the first and second peelable cover layers 308a and 308b may be formed of aluminum, chrome, copper or any other metal that is prepared to be peelable from a copper foil.

According to one example, the first and second conductive layers 310 and 310b may be an organic film. Alternatively, the first and second peelable cover layers 308a and 308b may be formed of thermoplastic resin that has a 120 degree Celsius or higher melting point temperature or thermosetting plastic.

According to one example, the first and second cover layers may be peelable by mechanical force or washed-off or removed by a solution.

According to one example, the dielectric layer 302 may include a dielectric material, for example, a prepreg, a bonding sheet, and/or sub-composite materials such as cured or partially cured resin and these may be impregnated with a reinforcement or reinforcing material or aggregate. Cured or partially cured resin may include epoxy, polyimide, polyphenylene ether (PPO), cyanate ester, hydrocarbon, polytetrafluoroethylene (PTFE), bismaleimide triazine (BT), phenol resin or any resin that is used for printed circuit board dielectric material as a pure or blended composition. Resin impregnated reinforcement may be used for the dielectric layer 302 and may include woven or unwoven glass fibers, Kevlar fibers, polyester fiber, carbon fiber, cellulose fiber or any other fiber that are used for printed circuit board. When unwoven reinforcement is used, this reinforcement may be fibers as chopped, powdered material, etc.

At a second stage (Stage B), a hole 312 may be formed (e.g. drilled) through the sub-composite structure 300. At a third stage (Stage C), plating resist 314 may be deposited into the hole 312, for example, using a via hole filling machine or any other method known in the industry. The deposition of the plating resist 314 may leave an excess (or residual) plating resist 316a on the first peelable cover layer 308a of first conductive film 304 and excess (or residual) plating resist 316b on the second peelable cover layer 308b of the second conductive film 306. At a fourth stage (Stage D), after the plating resist 314 has been cured, the first peelable cover layer 308a and the second peelable cover layer 308b may be peeled away leaving clean upper and lower surfaces of the core or sub-composite structure 300.

At a fifth stage (Stage E), the sub-composite structure 300 may then be laminated into a multilayer printed circuit board (PCB) 318 or other laminate structure. For instance, one or more layers 320 and 322 (e.g., conductive layers, dielectric layers, etc.) may be laminated onto a upper surface 316 and/or lower surface 317 of the sub-composite structure 300. In one example, additional dielectric layers and/or conductive layers may have been formed on to the sub-composite structure 300. For instance, the sub-composite structure 300 may be laminated with prepreg (bonding sheet) and conductive foil to form the multilayer PCB 318. The conductive layers (e.g., conductive foils) may be patterned to form electrical paths or traces.

At a sixth stage (Stage F), a through-hole 324 is drilled through the multilayer PCB 318, including the plating resist 314 in the sub-composite structure 300. The through-hole 324 may have a diameter smaller than the diameter of the first formed hole 312. The through-hole 324 may then be plated 326, for example, by placing the multilayer PCB 318 into a seed bath, followed by immersion in an electroless copper bath. The copper plating 326 in the through-hole 324 may be further thickened by electrolytic copper plating to achieve a target or desired thickness. Subsequently, surface circuit patterning may be formed on the upper and/or lower surfaces 328 and 330 of the multilayer PCB 318 and prepared with a surface finish such as solder mask, legend and metallization or organic surface preservative (OSP).

Figure 4A:
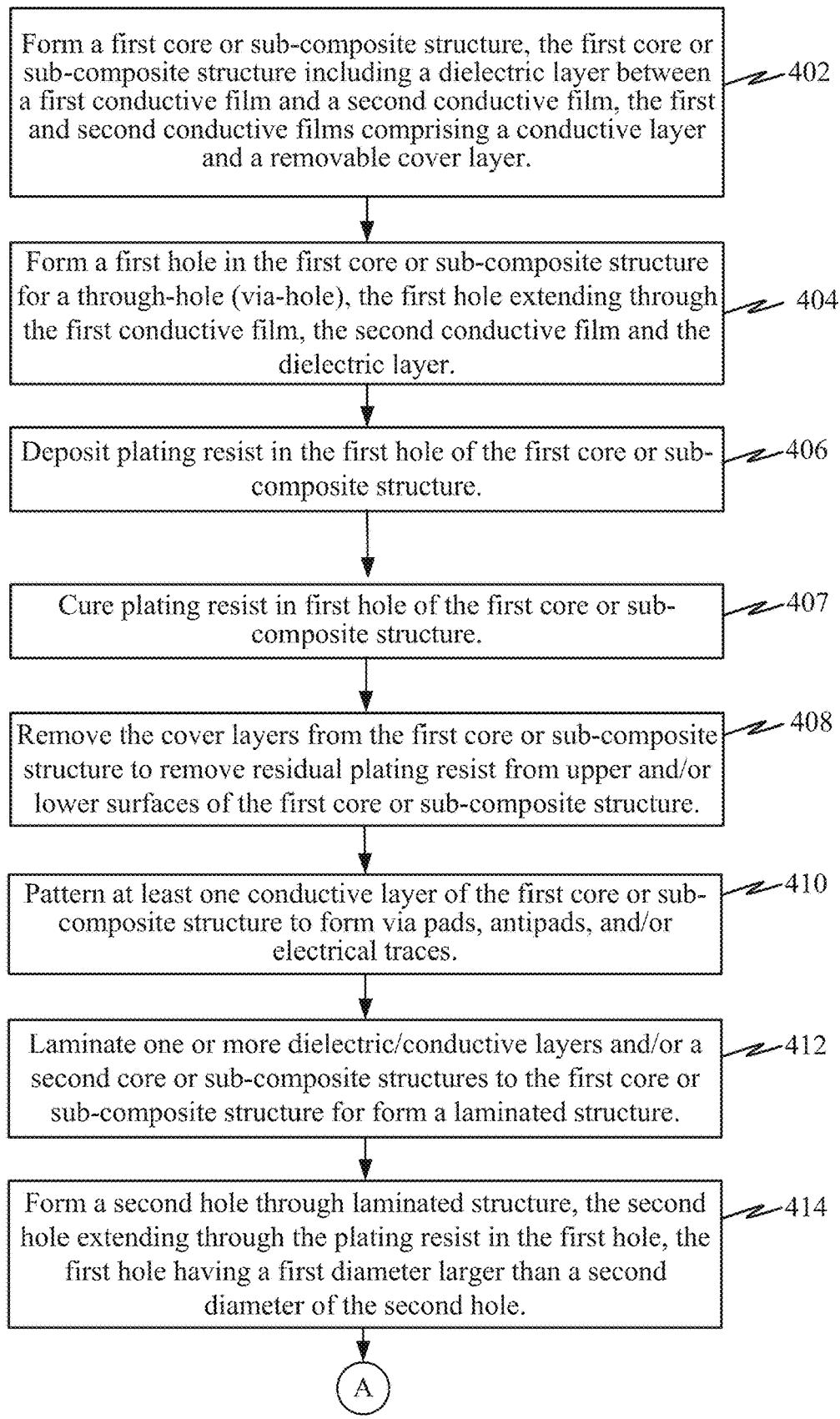
FIG. 4 (comprising FIGS. 4A and 4B) illustrates a method of forming a laminate structure having a vertically segmented plated through-hole, according to one aspect of the present invention.
Figure 4B:
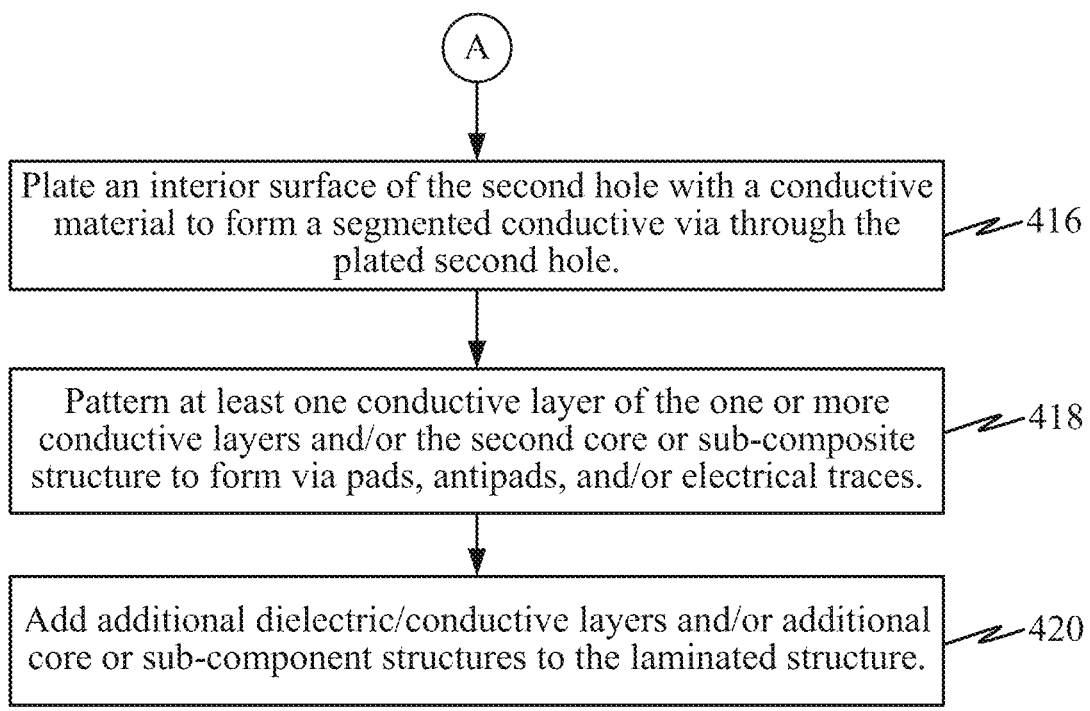

FIG. 4 (comprising FIGS. 4A and 4B) illustrates a method of forming a laminate structure having a plated through-hole, according to one aspect of the present invention. A first core or sub-composite structure may be formed, including a dielectric layer between a first conductive film and a second conductive film, the first and second conductive films comprising a conductive layer and a removable cover layer 402. For example, the first conductive film may comprise a first conductive layer or foil and a first removable/peelable cover layer and the second conductive film may comprise a second conductive layer or foil and a second removable/peelable cover layer.

According to one aspect, the first conductive layer, the second conductive layer and the dielectric layer may first be laminated together. The removable/peelable cover layers may be subsequently formed on a top and bottom surface of the laminate structure (e.g., on outer surfaces of the first and second conductive layers).

In one example, the first and second removable/peelable cover layers may first be coupled to the first conductive layer (to form the first conductive film) and the second conductive layer (to form the second conductive film). Then the first conductive film and second conductive film are coupled or laminated onto the dielectric layer.

In another example, the removable/peelable cover layers may be a film, a coating, or layer that may be removed by peeling, washing, chemical removal (by acid or other solution), heating, etc.

Next, a first hole is formed in the first core or sub-composite structure for a through-hole (via-hole), the first hole extending through the first conductive film, the second conductive film and the dielectric layer 404.

Plating resist may be deposited in the hole of the first core or sub-composite structure 406. The deposition of the plating resist may leave an excess (or residual) plating resist on the first removable/peelable cover layer and on the second removable/peelable cover layer. After the plating resist has been cured 407, the first and second removable/peelable cover layers are then removed/peeled off to remove residual plating resist from upper and/or lower surfaces of the first core or sub-composite structure 408.

After cleaning the top and bottom surfaces of the first core or sub-composite structure, at least one conductive layer of the first core or sub-composite structure may be patterned to form via pads, antipads, and/or electrical traces 410. One or more dielectric and conductive layers and/or a second core or sub-component structure may be laminated to the first core or sub-composite structure to form a laminated structure 412. For instance, the one or more dielectric layers and/or the second core or sub-component structure may be laminated on both sides of the first core or sub-composite structure. A second hole (e.g., a through-hole) may then be formed through the laminated structure, the second hole extending through the plating resist in the first hole, the first hole having a first diameter larger than a second diameter of the second hole 414. An interior surface of the second hole may be plated with a conductive material to form a segmented conductive via through the plated second hole 416. The portion of the segmented conductive via that includes the plating resist may be devoid of the conductive material.

In an alternative embodiment, the one or more dielectric/conductive layers and/or the second core or sub-component structure may be laminated on only one side of the first core or sub-composite structure. In such embodiment, the conductive via is not segmented, but extends through the second hole with the exception of the portion that includes plating resist.

At least one conductive layer of the one or more conductive layers and/or the second core or sub-composite structure may be patterned to form via pads, antipads, and/or electrical traces 418. Additional core or sub-composite structures and plated through-holes can be further added to the laminated structure 420.

In some implementations, the first core or sub-composite structure (e.g., flexible, semi-flexible/semi-rigid, or rigid) may include one or more conductive layers (e.g., foils) with one or more dielectric layers in between. In such implementations, the first core or sub-composite structure may have conductive layers on the top and bottom surfaces.

Figure 5:
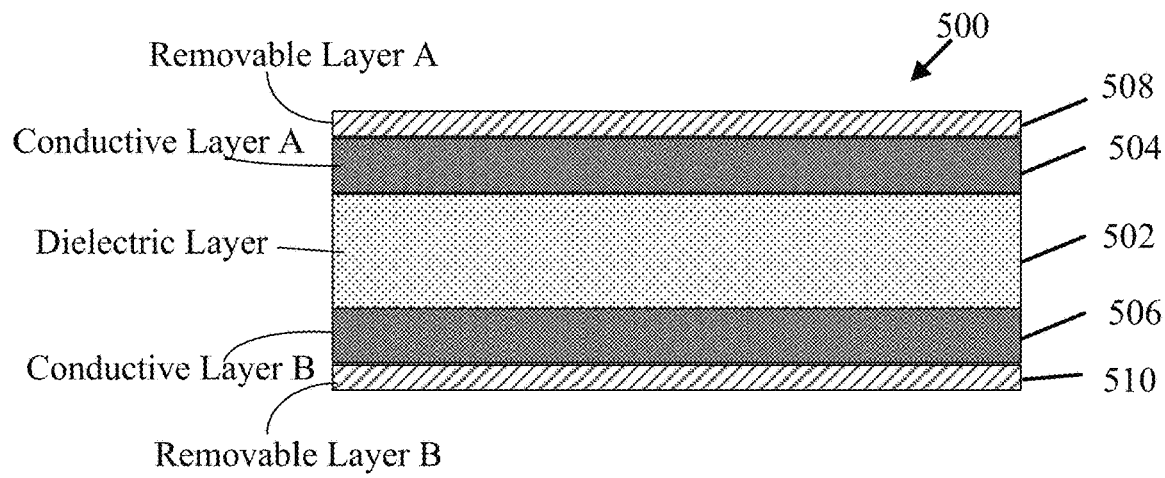
FIG. 5 illustrates an exemplary core or sub-composite structure.

FIG. 5 illustrates an exemplary core or sub-composite structure 500. The sub-composite structure 500 may comprise a dielectric layer 502 sandwiched between conductive layers 504 and 506. Removable and/or peelable layers 508 and 510 may be coupled to the outer surfaces of the conductive layers 508 and 506 prior to via formation (e.g., prior to drilling or plating) through the sub-composite structure 500.

Figure 6:
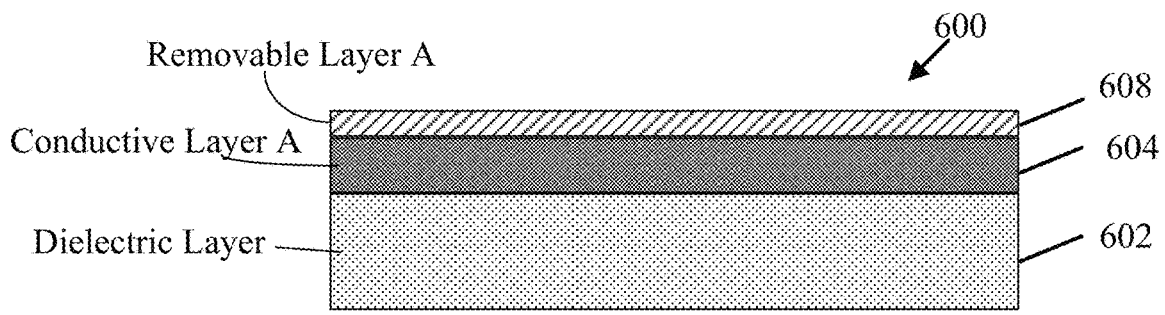
FIG. 6 illustrates another exemplary core or sub-composite structure.

FIG. 6 illustrates another exemplary core or sub-composite structure 600. The sub-composite structure 600 may comprise a dielectric layer 602 coupled to a conductive layer 604 on just one side. A removable and/or peelable cover layer 608 may be coupled to the outer surface of the conductive layer 608 prior to via formation (e.g., prior to drilling or plating) through the sub-composite structure 600.

Figure 7:
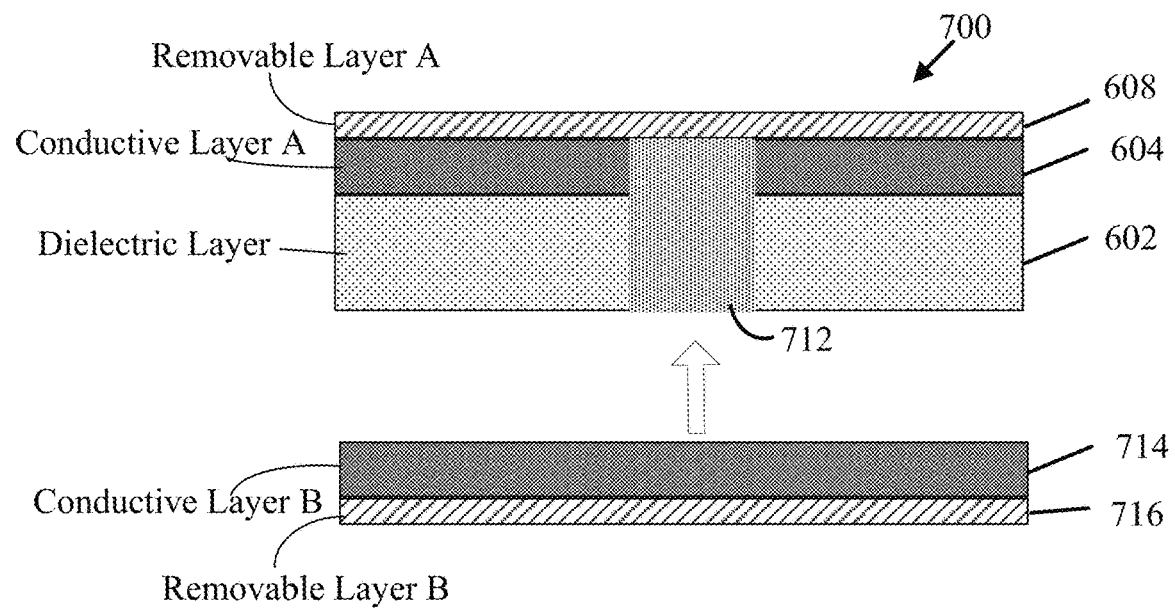
FIG. 7 illustrates yet another exemplary core or sub-composite structure.

FIG. 7 illustrates yet another exemplary core or sub-composite structure 700. The sub-composite structure 700 may comprise a dielectric layer 602 coupled to a conductive layer 604 on just one side. A removable and/or peelable cover layer 608 may be coupled to the outer surface of the conductive layer 608 prior to via formation (e.g., prior to drilling or plating) through the sub-composite structure 700. A hole is drilled through the sub-composite structure and plating resist material 712 is deposited or filled in the first hole. Subsequently, a second conductive layer 714 and removable or peelable second cover layer 716 may be coupled to an opposite side of the sub-composite structure 700.

The core or sub-composite structure of claim 1, wherein the core or sub-composite structure has a total thickness of 127 thousands of an inch (mil) or less.

In various examples, the core or sub-composite structure may have a total thickness of 63 thousands of an inch (mil) or less, 31 thousands of an inch (mil) or less, or 16 thousands of an inch (mil) or less. In other examples, each conductive layer may be tween 12-210 microns thick, or between 18-35 microns thick.

In the foregoing specification, embodiments of the invention have been described with reference to numerous specific details that may vary from implementation to implementation. The specification and drawings are, accordingly, to be regarded in an illustrative rather than a restrictive sense. The invention is intended to be as broad as the appended claims, including all equivalents thereto.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. A method for making a laminated structure, comprising:

forming a first core or sub-composite structure, the first core or sub-composite structure comprising:

a first conductive film comprising a removable or peelable first cover layer formed on a first conductive layer;

a dielectric layer coupled to the first conductive layer of the first conductive film;

forming a hole in the first core or sub-composite structure, the hole extending through the first conductive film and the dielectric layer;

depositing a plating resist in the hole in the first core or sub-component structure, and over at least a portion of the first cover layer; and removing the first cover layer to clean off excess or residual plating resist on the first core or sub-component structure.

2. The method of claim 1, further comprising:

forming a through-hole through the first core or sub-composite structure and the plating resist; and plating an interior surface of the through-hole with a conductive material forming a segmented plated through-hole.

3. The method of claim 1, further comprising:

patterning at least of the first conductive layer to form via pads, antipads, and/or electrical traces.

4. The method of claim 1, further comprising:

laminating one or more additional dielectric layers and one or more additional core or sub-composite structures to the first core or sub-composite structure.

5. The method of claim 1, wherein the removable or peelable first cover layer is less than 35 microns.

6. The method of claim 1, wherein the first conductive layer has a thickness of between 3 microns and 210 microns.

7. The method of claim 1, wherein the first conductive layer has a thickness of between 12 microns and 35 microns.

8. The method of claim 1, wherein the first core or sub-composite structure further comprises:

a second conductive film comprising a second peelable cover layer formed on a second conductive layer, the second conductive layer coupled to the core or sub-composite structure on a surface opposite the first conductive film.

* * * * *